(12) United States Patent
Dodd et al.

(10) Patent No.: US 9,873,250 B2
(45) Date of Patent: Jan. 23, 2018

(54) MICROFLUIDIC ASSEMBLY WITH MECHANICAL BONDS

(71) Applicants: STMICROELECTRONICS, INC., Coppell, TX (US); STMICROELECTRONICS S.R.L., Agrate Brianza (IT)

(72) Inventors: Simon Dodd, West Linn, OR (US); Andrea Nicola Colecchia, Agrate Brianza (IT)

(73) Assignees: STMICROELECTRONICS, INC., Coppell, TX (US); STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/260,218

(22) Filed: Sep. 8, 2016

(65) Prior Publication Data
US 2017/0259568 A1   Sep. 14, 2017

Related U.S. Application Data

(60) Provisional application No. 62/308,119, filed on Mar. 14, 2016.

(51) Int. Cl.
*B41J 2/14* (2006.01)
*H01L 23/00* (2006.01)

(52) U.S. Cl.
CPC ............ *B41J 2/1433* (2013.01); *H01L 24/09* (2013.01); *B41J 2002/14491* (2013.01); *H01L 2224/0401* (2013.01)

(58) Field of Classification Search
CPC ............. H01L 24/48; H01L 2224/0401; H01L 24/05; H01L 2224/04042; H01L 24/13; H01L 24/29; H01L 24/11; H01L 24/03; H01L 24/06; H01L 24/12; H01L 24/17; H01L 24/14; H01L 24/09; B41J 2/14129; B41J 2/14072; B41J 2/17526; B41J 2/1433; B41J 2002/14491
See application file for complete search history.

(56) References Cited

U.S. PATENT DOCUMENTS

| | | | |
|---|---|---|---|
| 7,658,470 B1 * | 2/2010 | Jones | B41J 2/14072 347/50 |
| 9,211,980 B1 * | 12/2015 | Gruenbacher | B41J 2/1433 |
| 2008/0185705 A1 * | 8/2008 | Osborn | H01L 23/49811 257/690 |
| 2012/0025358 A1 * | 2/2012 | Minotti | H01L 23/49537 257/675 |
| 2013/0234344 A1 * | 9/2013 | Juskey | H01L 24/83 257/778 |
| 2015/0367370 A1 | 12/2015 | Dodd et al. | |

* cited by examiner

*Primary Examiner* — Jannelle M Lebron
(74) *Attorney, Agent, or Firm* — Seed Intellectual Property Law Group LLP

(57) ABSTRACT

Embodiments of the present disclosure are directed to a microfluidic delivery system that includes a microfluidic semiconductor die coupled to a flexible interconnect substrate to form an assembly. At least one embodiment is directed to a semiconductor die having an active surface that includes a layout that has electrically active bond pads along one side of the active surface of the die. A second side of the active surface of the die includes one or more mechanical pads.

20 Claims, 8 Drawing Sheets

MICROFLUIDIC ASSEMBLY WITH MECHANICAL BONDS

BACKGROUND

Technical Field

Embodiments are directed to a microfluidic delivery member, an assembly, and methods of forming the same.

Description of the Related Art

Traditional thermal inkjet systems utilize a microfluidic semiconductor die, such as a thermal inkjet die, attached to a flexible interconnect substrate. Typically, the flexible interconnect substrate and the microfluidic semiconductor die form an assembly that may be then mounted on a substrate, which may be made of a plastic material, such as polyethylene terephthalate (PET) and polyphenylene sulfide (PPS). The flexible interconnect substrate flexes so that the nozzles of the die and the external electrical connections of the substrate can be on different physical planes. Typically, electrical bond pads of the die are on two or more of the four sides or edges of the die. Thus, where the die is electrical coupled to the flexible substrate, the die is suitably mechanically coupled thereto as well. Subsequent processing of the assembly, such as encapsulating the die, may then be performed without issue.

BRIEF SUMMARY

Embodiments of the present disclosure are directed to a microfluidic delivery system that includes a microfluidic semiconductor die coupled to a flexible interconnect substrate to form an assembly. At least one embodiment is directed to a semiconductor die having an active surface that includes a layout that has electrically active bond pads along one side of the active surface of the die. A second side of the active surface of the die includes one or more mechanical pads.

To form an assembly, the active surface of the semiconductor die is located in a through hole of the flexible interconnect substrate. The semiconductor die is coupled to the flexible interconnect substrate by electrical bond pads and mechanical pads. Thus, the semiconductor die is coupled to the flexible interconnect substrate along the first side of the die and the second side of the die. In one embodiment, the second side of the active surface of the die is opposite the first side of the active surface of the die.

One or more of the other sides of the die may include bond pads that are primarily mechanical in function; however, they may also be electrically coupled to ground. The die may include any number of mechanical pads, and the mechanical pads may be located at any position that assists in mechanically bonding the die to the flexible interconnect substrate. The mechanical pads do not receive or send signals to active components in the semiconductor die.

The flexible interconnect substrate includes exposed contacts that are configured to couple with the mechanical pads of the die. These exposed contacts are dummy contacts in that they are not electrically coupled to circuits of the semiconductor die, but it is to be appreciated that the exposed contacts on the flexible interconnect substrate may be coupled to ground. The flexible interconnect substrate may include a Kapton® polyimide film.

By adding mechanical pads, such as in one embodiment in which the mechanical bond pads are added to a side of the die that is opposite to the electrical bond pads, the flexible interconnect substrate can connect to the die in a single plane, rather than along a single line. Thus, the semiconductor die is more readily secured to the flexible interconnect substrate. These mechanical pads provide a more robust assembly for subsequent processing of the flexible interconnect die assembly.

Furthermore, the mechanical pads are advantageous because their placement can be fairly arbitrary on the die. That is, the mechanical pads may be located along any edge and at any location. Furthermore the mechanical pads do not need to be covered by encapsulation material; however, they may be covered by encapsulation material in some embodiments. To prevent charge buildup it may be desirable to have the mechanical pads, the exposed contacts of the flexible interconnect substrate, or both, coupled to ground.

Components of the flexible interconnect die assembly may be components of the microfluidic delivery system as shown and described in U.S. Patent Publication No. 2015/0367370, which is hereby incorporated by reference in its entirety for all purposes.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

Figure 1A:
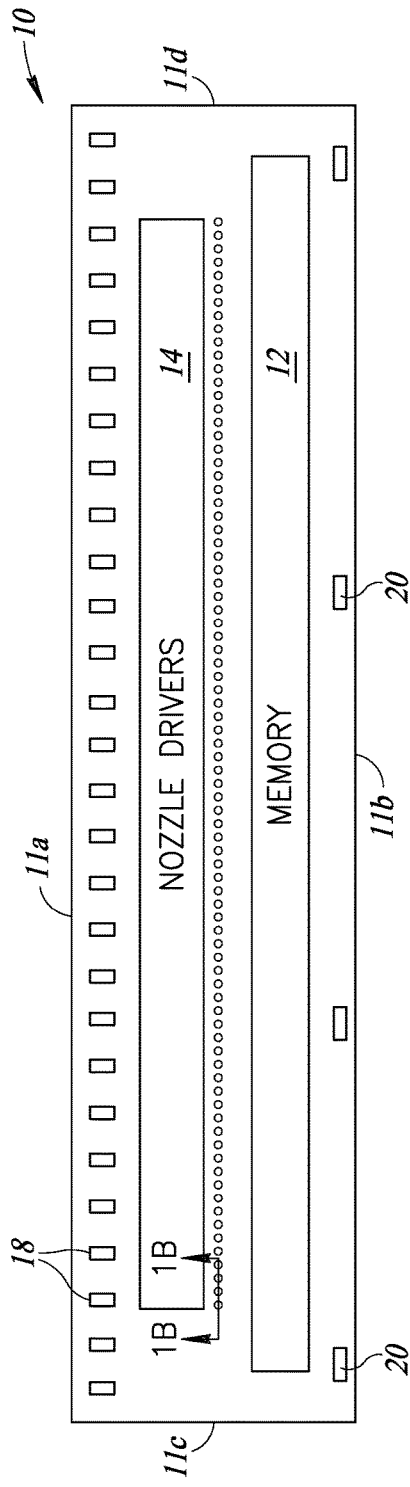
FIG. 1A is a schematic illustration of a microfluidic semiconductor die according to one embodiment.
Figure 1B:
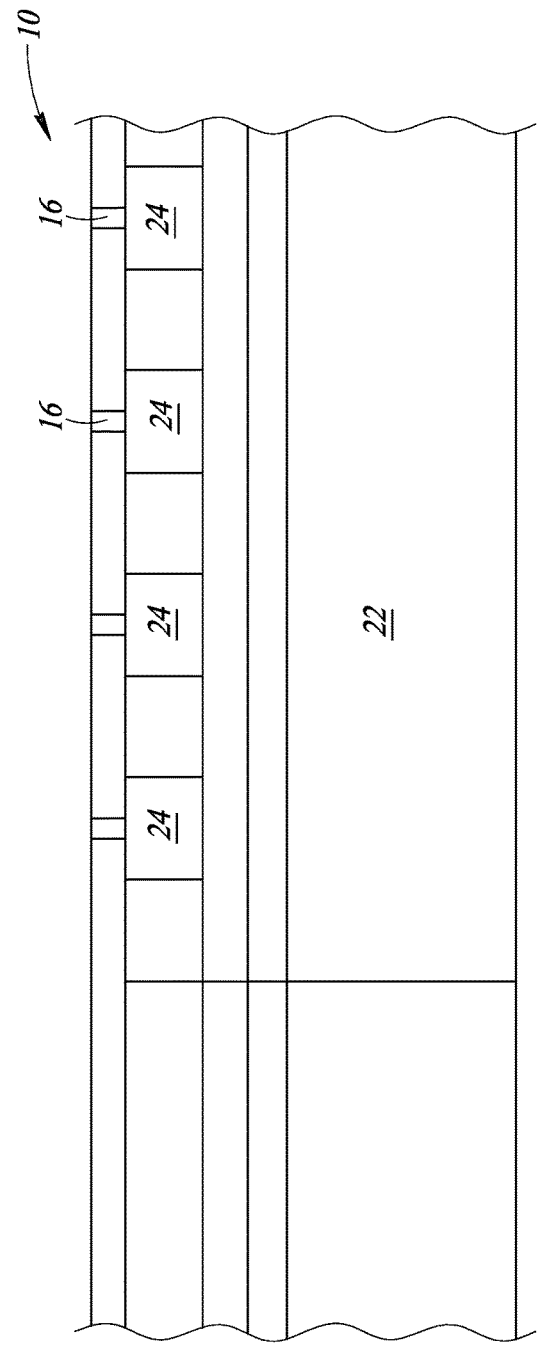
FIG. 1B is a partial close-up cross-sectional view of the microfluidic semiconductor die of FIG. 1A.

FIG. 1A is a schematic illustration of a microfluidic semiconductor die 10 according to one embodiment, while FIG. 1B is a partial close-up cross-sectional view of the microfluidic semiconductor die 10. The microfluidic semiconductor die 10 includes one or more electrical components, such as integrated circuits. The microfluidic semiconductor die 10 is made from a semiconductor material, such as silicon, and includes an active surface in which integrated circuits are formed. The integrated circuits may be analog or digital circuits implemented as active devices, passive devices, conductive layers, and dielectric layers formed within the microfluidic semiconductor die and electrically interconnected according to the electrical design and function of the microfluidic semiconductor die 10. For instance, the microfluidic semiconductor die 10 may include integrated circuits forming memory circuitry 12 and nozzle drivers 14 at an active upper surface as represented in block form in FIG. 1A.

The nozzle drivers 14 may include selection and driving transistors that drive one or more ejection elements that cause fluid to be ejected from nozzles 16 in the microfluidic semiconductor die 10. The memory circuitry 12 may store information related to a printhead or cartridge that will receive the microfluidic semiconductor die 10, such as an identification number, and information about the fluid in the printhead, such as an initial fluid level, as well as information about the microfluidic die 10 itself.

The active upper surface of the microfluidic semiconductor die 10 is defined by first and second opposing sides 11a, 11b that are coupled together by third and fourth sides 11c, 11d. A row of electrical bond pads 18 are located on the upper surface at the first side 11a of the microfluidic semiconductor die 10. The electrical bond pads 18 are coupled to the integrated circuits of the microfluidic semiconductor die 10. For instance, the electrical bond pads 18 may be coupled to signal and power transistors that cause ejection elements, such as heater elements, to cause fluid to expel from nozzles of the microfluidic semiconductor die 10. One or more of the electrical bond pads 18 may also be coupled to ground.

Four mechanical pads 20 are located on the upper surface at the second side 11b of the microfluidic semiconductor die 10. The mechanical pads 20 are not coupled to active or passive circuitry of the microfluidic semiconductor die 10. Rather, the mechanical pads 20 function to be used to mechanically couple the microfluidic semiconductor die 10 to a substrate, as will be explained in more detail in reference to FIG. 3.

Although the mechanical pads' 20 primary role is for mechanical coupling, the mechanical pads 20 may also be coupled to ground. Thus, the mechanical pads 20 may be made of a conductive material, such as the same conductive materials as are used to form the electrical bond pads 18. Furthermore, although four mechanical pads are shown, it is to be appreciated that the microfluidic semiconductor die may include any number of mechanical pads, including only one pad.

As best shown in FIG. 1B, the microfluidic semiconductor die includes an inlet 22 that extends to a back surface (not shown) of the microfluidic semiconductor die 10. The inlet 22 receives fluid from a fluid source, such as a reservoir or a through opening of a substrate that is in fluid communication with a fluid source, and provides the fluid to a plurality of chambers 24 formed in the microfluidic semiconductor die 10 below the nozzles 16. The nozzles 16 are formed in a nozzle plate that covers the chambers 24. The nozzles 16 are configured to expel the fluid in the chambers 24. Although a single nozzle is located over each chamber, it is to be appreciated that a plurality of nozzles may be formed in the nozzle plate over a single chamber for expelling fluid from that chamber.

In one embodiment, to expel the fluid, heater elements are provided at each chamber 24, such as at a bottom surface of the chamber 24. The heater elements, which may be resistance heater elements, are coupled to one or more of the electrical bond pads 18, as is well known in the art.

In operation, fluid may be expelled through the nozzles 16 in response to one or more signals received by the electrical bond pads 18, which causes the heating elements to heat the fluid in the chamber 24 so that the fluid vaporizes to create a bubble. The expansion that creates the bubble causes a droplet to form and eject from the nozzle 16. Other ejection elements may be used for causing fluid to be ejected from the nozzles 16. For instance, the microfluidic semiconductor die 10 may include piezoelectric elements rather than heating elements. The piezoelectric elements expand and contract in response to signal inputs to the electrical bond pads to cause fluid to expel from the nozzles, as is well known in the art.

Figure 2:
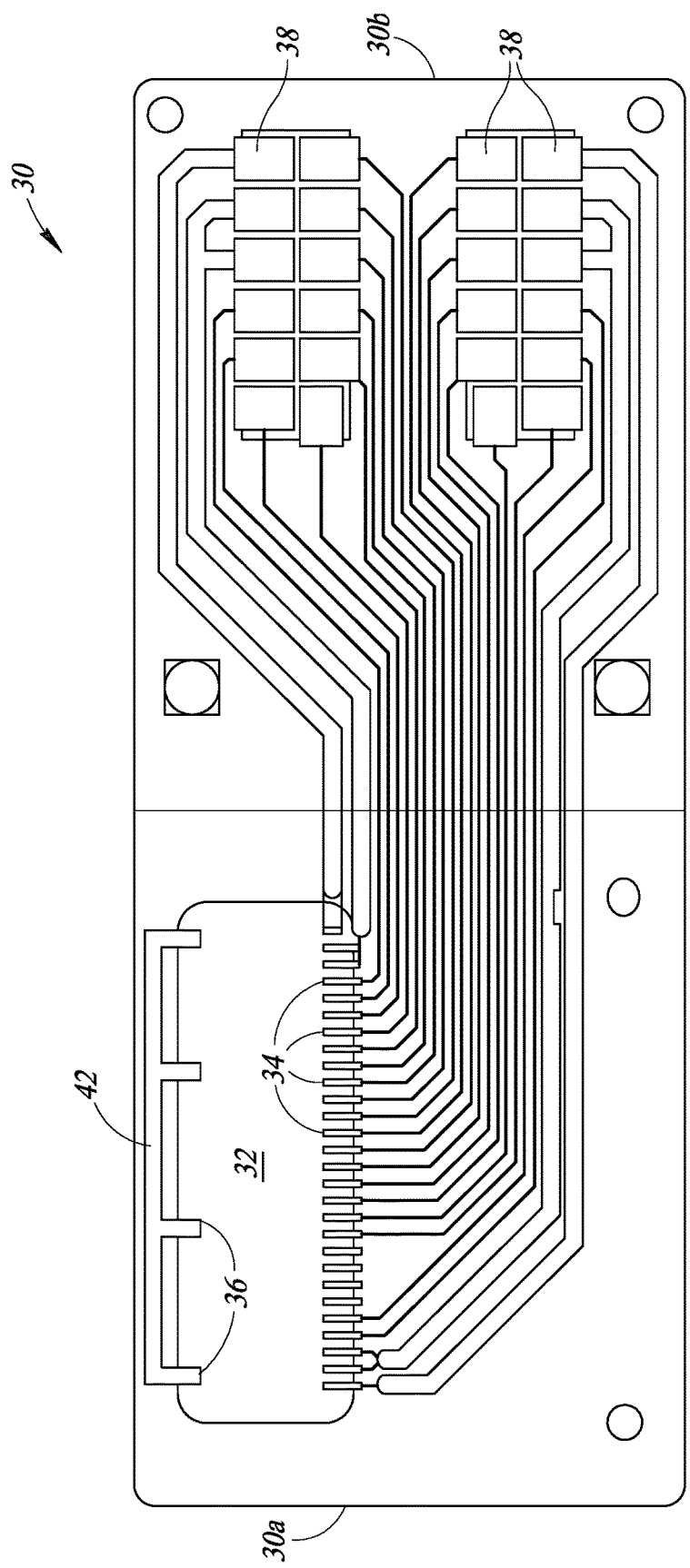
FIG. 2 is a schematic illustration of a flexible interconnect substrate according to one embodiment.

FIG. 2 is a top view of a schematic illustration a flexible interconnect substrate 30 in accordance with one embodiment. The flexible interconnect substrate 30 includes a first end 30a and a second end 30b. The first end 30a of the flexible interconnect substrate 30 includes a through opening 32 for receiving an active surface of a microfluidic semiconductor die, such as the microfluidic semiconductor die 10 of FIGS. 1A and 1B. Electrical contacts 34 extend into the through opening 32 at a first (bottom) side of the through opening 32. Mechanical contacts 36 extend into the through opening 32 at a second (upper) side of the through opening 32. The second end 30b of the flexible interconnect substrate 30 includes interconnect contacts 38. The electrical contacts 34 are coupled to interconnect contacts 38 of the flexible interconnect substrate 30 by traces 40.

The flexible interconnect substrate 30 includes a first insulative layer that is made from a flexible material, such as a polyimide layer. In one embodiment the first insulative layer is Kapton® polyimide film.

The electrical contacts 34 are located on a surface of the first insulative layer at the first side of the through opening 32 and extend therefrom into the through opening 32. Similarly, the mechanical contacts 36, which include four mechanical contacts in the illustrated embodiment, are located on a surface of the first insulative layer at the second side of the through opening 32 and extend therefrom into the through opening 32. The mechanical contacts 36 may be coupled to each other as shown by a trace 42 formed on the surface of the first insulative layer. Alternatively, the mechanical contacts 36 may be isolated from each other. Each of the electrical contacts 34 is coupled to a respective interconnect contact at the second end 30b of the flexible interconnect substrate 10 by a trace 40 located on the first insulative layer.

The electrical and mechanical contacts 34, 36, the interconnect contacts 38, and the traces 40, 42 are formed on a planar surface of the first insulative layer and thus are formed on a single plane. Therefore, various stacks within the flexible interconnect substrate 30 are not needed. Furthermore, by forming the electrical contacts 34 at the second side of the through opening 32, traces 40 and interconnect contacts 38 are simplified.

The electrical and mechanical contacts 34, 36, the interconnect contacts 38, and the traces 40, 42 are made from one or more conductive materials. In one embodiment, electrical and mechanical contacts 34, 36, the interconnect contacts 38, and the traces 40, 42 include a seed layer, a nickel layer, and a copper layer. The electrical and mechanical contacts 34, 36 and the interconnect contacts 38 may further include an upper gold layer.

A second insulative layer is placed over the traces 40, 42 and the first insulative layer, while the electrical and mechanical contacts 34, 36 and the interconnect contacts 38 remain exposed from the second insulative layer. The second insulative layer protects the traces 40, 42 from damage, such as corrosion, physical damage, moisture damage, or other causes of damage to conductive elements. The second insulative layer may be any insulative material and may include an adhesive layer, such as glue, that couples the insulating layer to the first insulative layer and the traces 40, 42. The adhesive layer may, in some embodiments, be activated in response to being exposed to heat and/or ultraviolet (UV) light. In one embodiment, the second insulative layer is a film or tape.

Figure 3A:
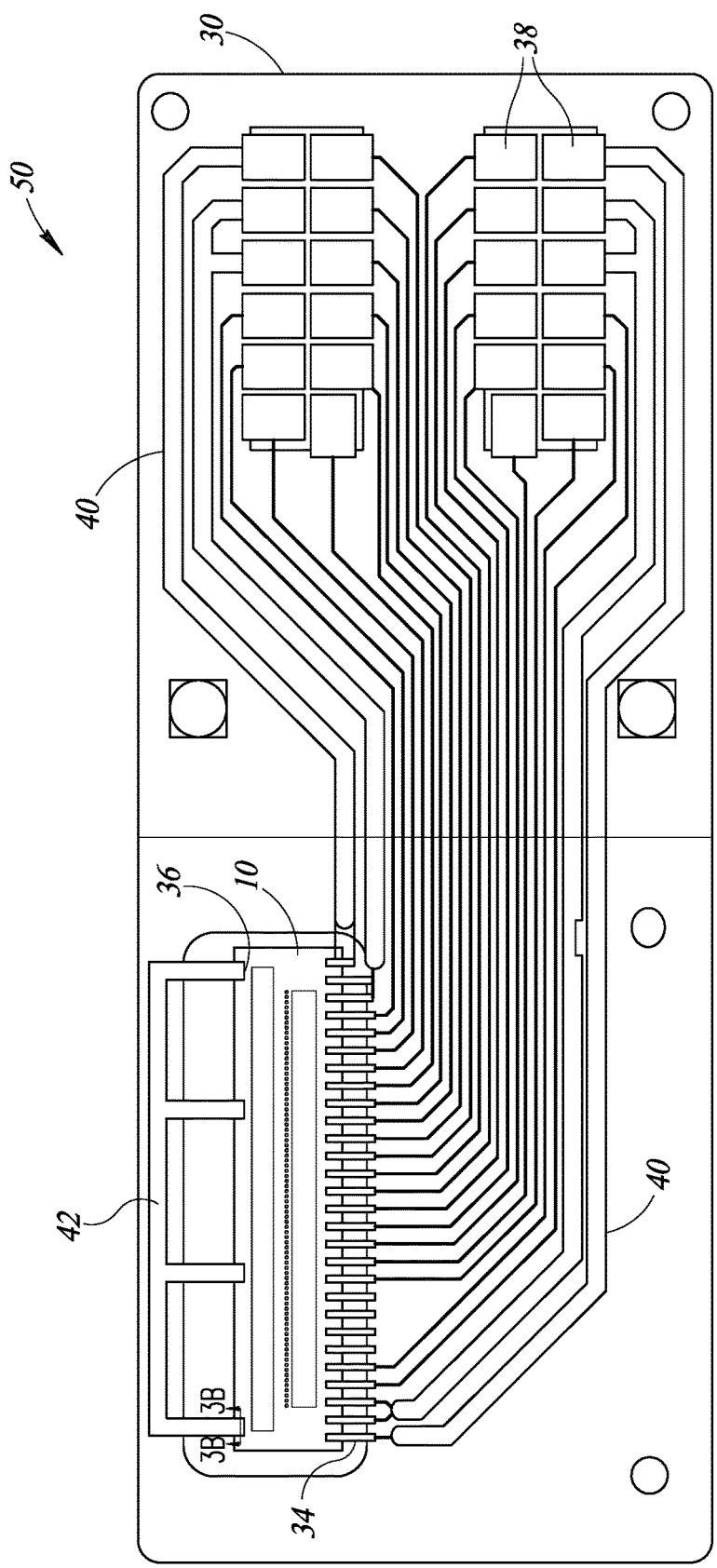
FIG. 3A is an assembly that includes the microfluidic semiconductor die of FIGS. 1A and 1B and the flexible interconnect substrate of FIG. 2.

FIG. 3A is an assembly 50 that includes the microfluidic semiconductor die 10 of FIGS. 1A and 1B located in the through opening 32 of the flexible interconnect substrate 30 of FIG. 2. In particular, the active face of the microfluidic semiconductor die 10 is located in the through opening 32 and facing upward towards the electrical and mechanical contacts 34, 36 that extend into the through opening 32. Although not visible in this view, the mechanical pads 20 of the microfluidic semiconductor die 10 are facing upwards towards and in contact with the mechanical contacts 36 of the flexible interconnect substrate 30 that extend into the through opening 32. Similarly, the electrical bond pads 18 of the microfluidic semiconductor die 10 are facing upwards toward and in contact with the electrical contacts 34 of the flexible interconnect substrate 30 that extend into the through opening 32.

It is to be appreciated that a back portion of the microfluidic semiconductor die 10 may extend from a back surface of the flexible interconnect substrate 30. That is, the back portion of the microfluidic semiconductor die 10 extends beyond a back surface of the first insulative layer of the flexible interconnect substrate 30. In one embodiment, the microfluidic semiconductor die 10 is about 400 to 600 microns thick, while the flexible interconnect substrate 30 is about 25-70 microns thick.

Figure 3B:
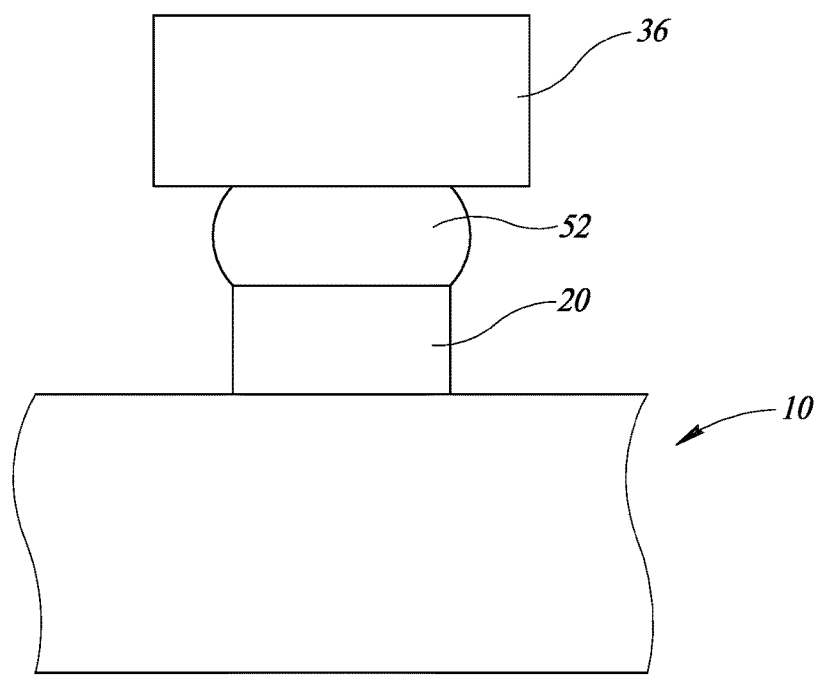
FIG. 3B is a partial close-up cross-sectional view of the assembly of FIG. 3A.

The electrical contacts 34 of the flexible interconnect substrate 30 are coupled to the electrical bond pads 18 of the microfluidic semiconductor die 10 by conductive elements. Similarly the mechanical contacts 36 of the flexible interconnect substrate 30 are coupled to the mechanical pads 20 of the microfluidic semiconductor die 10 by conductive elements 52, as best shown in FIG. 3B. The mechanical contacts 36 do not receive or send electrical signals to and from electrical components of the microfluidic semiconductor die 10.

The conductive elements 52 in FIG. 3B are solder balls, but may be wire bonds, tape automated bonds (TAB), and anisotropic conductive film (ACF). As will be clear to persons of ordinary skill in the art, ACF involves conductive balls embedded in a polymer that, when pressure is applied, allows the balls to break free in the polymer and make contact with the conductive elements, such as bond pads of the die and contacts of the flexible interconnect substrate, on opposing sides.

If wire bonds and TAB are used, the pads of the die may be offset from the respectively coupled to contacts of the substrate, as will clear to persons of ordinary skill in the art. TAB is a conductive tape that has first ends coupled to the bond pads of the die and second ends coupled to the contacts of the flexible interconnect substrate. To encourage bonding heat, pressure, and/or ultrasonic energy may be applied to the TAB and the bond pads and contacts.

In reference to FIG. 3A, the mechanical connection between the mechanical pads 20 at the second side 11b of the microfluidic semiconductor die 10 and the mechanical contacts 36 at the second side of the through opening 32 of the flexible interconnect substrate 30 provide improved mechanical coupling between the die and substrate. That is, by providing mechanical pads 20 on the second side 11b of the die 10, the die 10 is more readily held to the substrate 30. For instance, without some the coupling between the mechanical pads 20 and the mechanical contacts 36, the die 10 would only be coupled to the flexible substrate 30 along one side, at the electrical bond pads 18 and electrical contacts 34. Thus, the die could become floppy in the through opening 32. Thus, by adding the mechanical coupling to the second side 11b of the die 10, the die 10 is more readily secured to the substrate 30 and further processing of the assembly 50 may be more easily conducted.

In the illustrated embodiment, the size of the mechanical contacts 36 of the flexible interconnect substrate 30 are larger than the size of the electrical contacts 34 of the flexible interconnect substrate 30. The extra size or width on the mechanical contacts 36 may provide better mechanical coupling and provide additional support to the flexible interconnect substrate 30.

Although the coupling between the mechanical pads 20 and the mechanical contacts 36 is mechanical, it is to be appreciated that mechanical pads 20 and mechanical contacts 36 may be coupled to ground, such as by the single trace 42 shown or by individual traces.

Figure 3C:
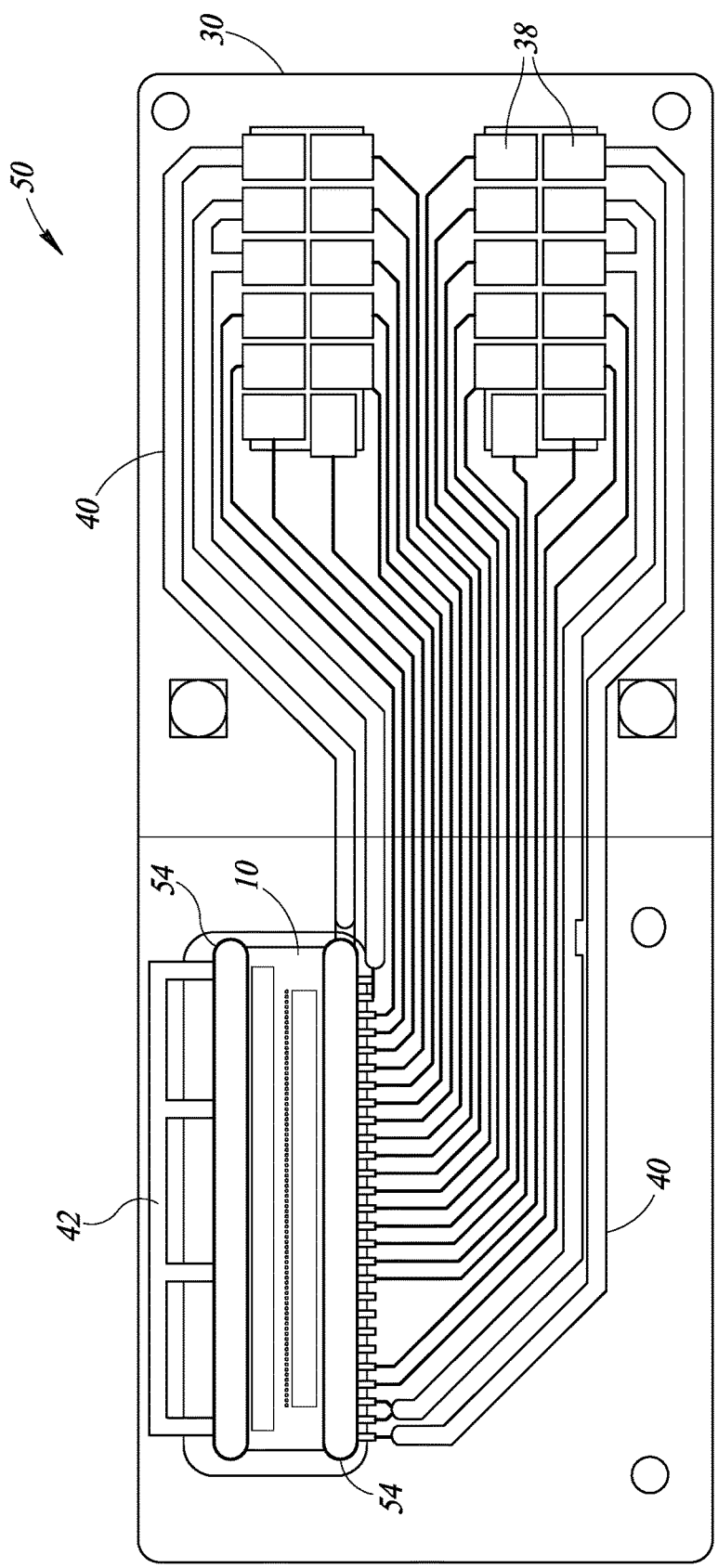
FIG. 3C is the assembly of FIG. 3A with encapsulant in accordance with one embodiment.

FIG. 3C illustrates the assembly 50 of FIG. 3A with encapsulant 54 around exposed conductive components of the assembly. In particular, the encapsulant 54 is located over the conductive elements 52, the electrical and mechanical pads 18, 20 of the microfluidic semiconductor die 10, and the electrical and mechanical contacts 34, 36 of the flexible interconnect substrate 30. Although not shown, the encapsulant 54 may extend around the entire perimeter of the die 10. In one embodiment, the encapsulant 54 is located on the electrical pads 18 and electrical contacts 34 and not located on the mechanical pads 20 and mechanical contacts 36. The encapsulant 54 is an insulative material that protects the conductive components from damage, such as corrosion, physical damage, moisture damage, or other causes of damage to electrical components. The encapsulant also aids in coupling the microfluidic semiconductor die 10 to the flexible interconnect substrate 30. The encapsulant 54 may be dispensed as an adhesive bead over the conductive components.

It is to be appreciated that the interconnect contacts 38 are for electrically coupling the assembly 50 to a separate component or device. In operation, the interconnect contacts 38 receive signals from the separate component or device that activate electrical components of the microfluidic semiconductor die 10 as mentioned above to cause the nozzles to expel a fluid.

Figure 4:
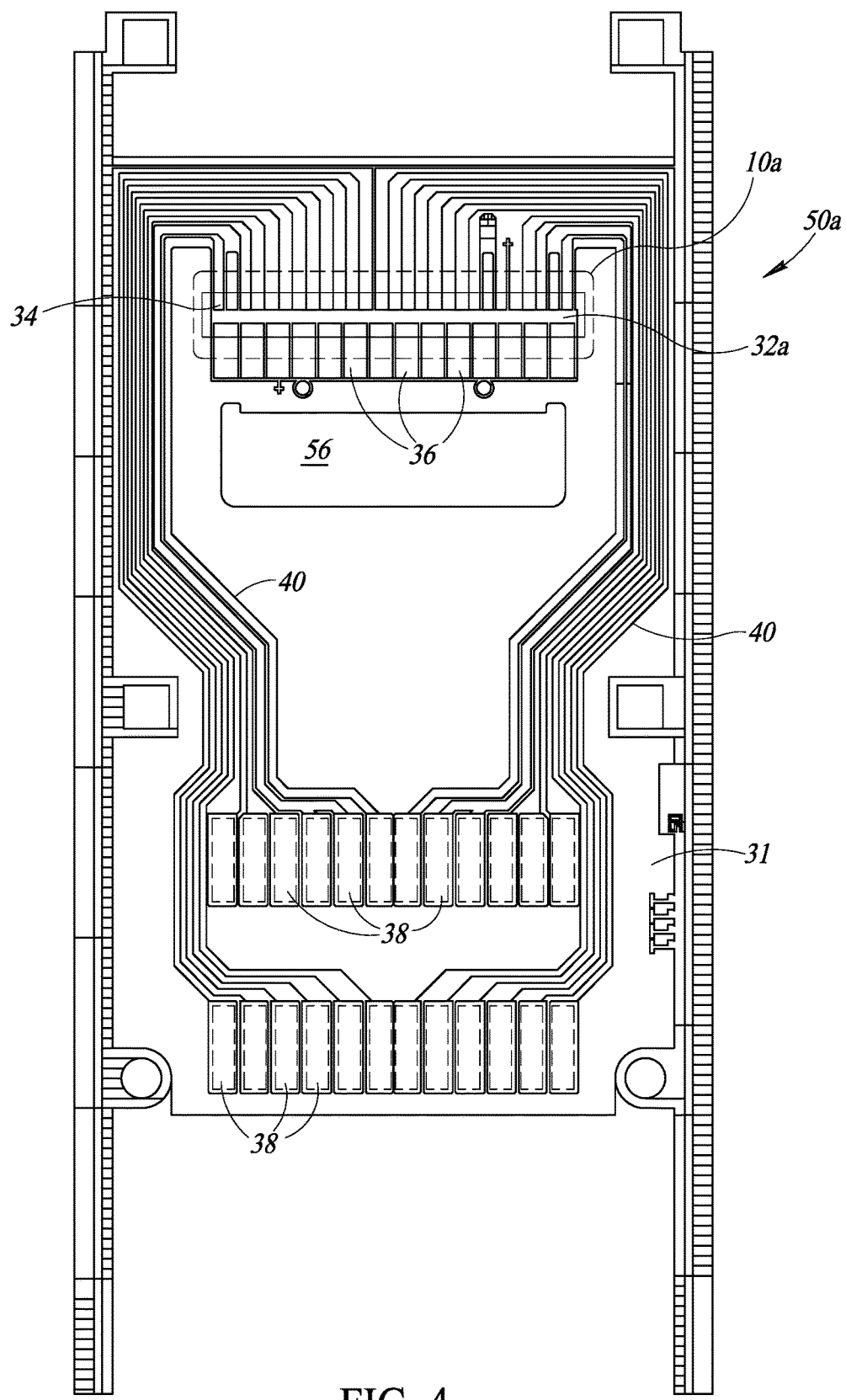
FIG. 4 is a schematic illustration of an assembly according to another embodiment.

FIG. 4 is a schematic illustration of an assembly 50a according to another embodiment. The assembly 50a of FIG. 4 includes a flexible interconnect substrate 31 that is substantially the same in structure and function as the flexible interconnect substrate 30 of FIG. 3A, except for the differences that will be discussed below.

Similarly, the microfluidic semiconductor die 10a of FIG. 4 is substantially the same in structure and function as the semiconductor die 10 of FIG. 1, except that the semiconductor die 10a of FIG. 4 includes a different number, size, and spacing of electrical bond pads 18 at the first side of the die 10a and of mechanical pads 20 at the second side of the die 10a. The perimeter of the semiconductor die 10a is shown in dashed line of FIG. 4. The details of the semiconductor die 10a, however, are not shown in FIG. 4 so as not to obscure details regarding the flexible interconnect substrate 31.

The flexible interconnect substrate 31 of FIG. 4 includes a different layout than the flexible interconnect substrate 30 of FIG. 3A. In particular, the through opening 32a in the substrate 31 is orientated 90 degrees from the through opening 32 of the flexible interconnect substrate 30 of FIG. 3A and thus the traces 40 follow a different path. In particular, the traces 40 that travel along side surfaces of the through opening 32a from the first end 30a of the flexible interconnect substrate 31 to the second end 30b of the flexible interconnect substrate 31.

Furthermore, the flexible interconnect substrate 31 includes mechanical contacts 36 at the second side of the opening 32a that are larger in size and quantity and spaced closer together than the flexible interconnect substrate 30 of FIG. 3A. It is to be appreciated that the number of mechanical contacts 36 of the flexible interconnect substrate 31 typically corresponds to the number of mechanical pads 20 at the second side 11b of the die 10a.

Similarly, the flexible interconnect substrate 31 includes electrical contacts 34 at the first side of the opening 32 that are larger in size and quantity and spaced closer together than the electrical contacts 36 of the flexible interconnect substrate 30 of FIG. 3A. It is to be appreciated that the number of electrical contacts 34 of the flexible interconnect substrate 31 typically corresponds to the number of electrical contact pads 18 at the first side 11a of the die 10a.

The flexible interconnect substrate 31 of FIG. 4 includes a second through opening 56. The second through opening 56 increases the flexibility of the substrate 31, particularly proximate the second through opening 56. In that regard, the second through opening 56 allows the flexible interconnect substrate 31 to bend readily for coupling to a reservoir, as shown in reference to FIG. 5.

Figure 5:
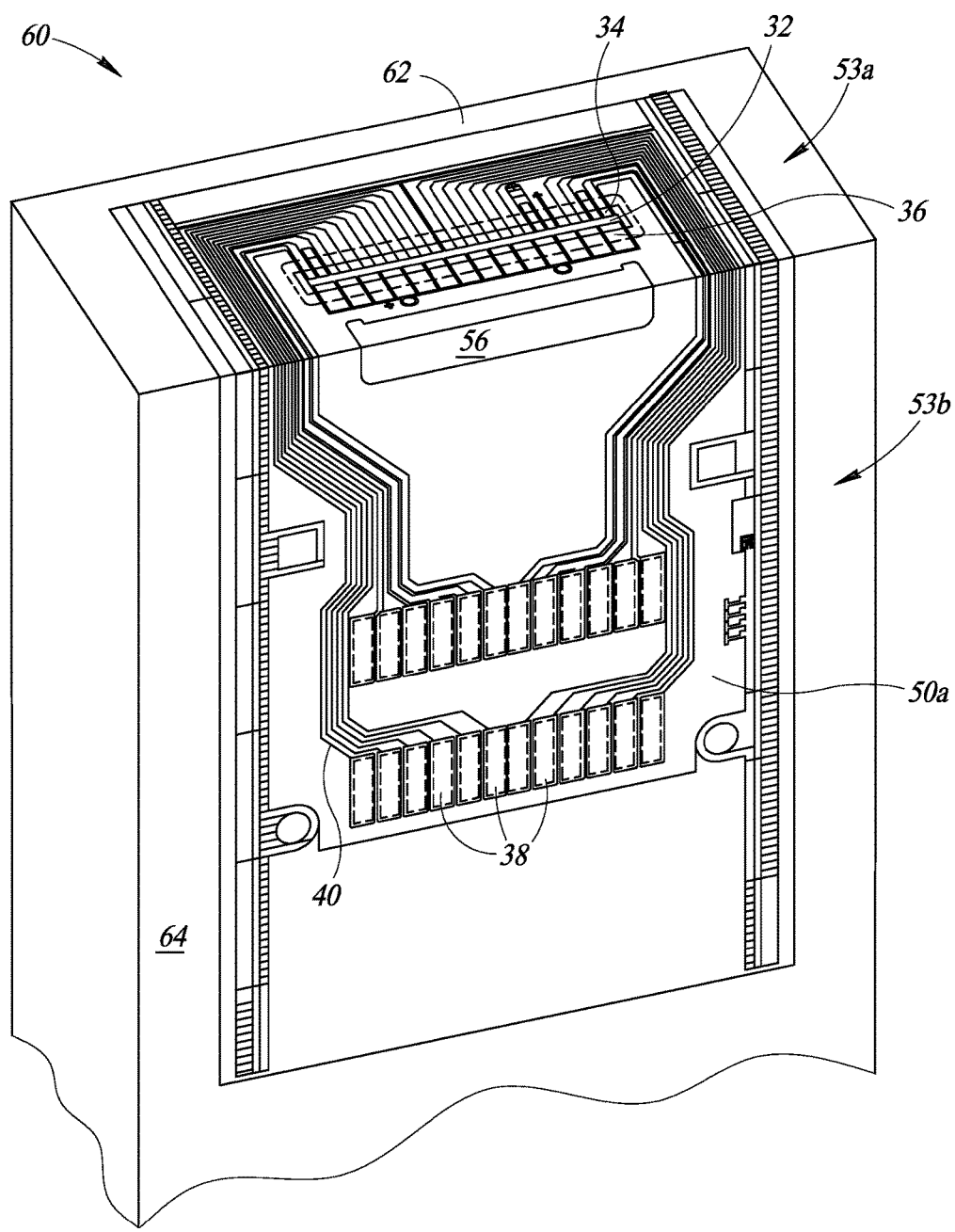
FIG. 5 is a schematic illustration of the assembly of FIG. 4 coupled to a printhead according to one embodiment.

FIG. 5 is a schematic illustration of a printhead 60 that includes the assembly 50a coupled thereto. Although not shown, it is to be appreciated that a portion of the assembly 50a is coupled to the printhead 60 by a substrate that is coupled to a back surface of the microfluidic semiconductor die 10a. The substrate may be formed of polyphenylene sulfide (PPS) and includes a through opening in fluid communication with the inlet of the microfluidic semiconductor die 10a of the assembly 50a. The microfluidic semiconductor die 10a is coupled to the substrate by adhesive and the substrate is coupled to the printhead 60 by adhesive. The adhesive may be any adhesive that couples the components together, and in one embodiment is glue.

The printhead 60 includes a reservoir containing a fluid and a lid for covering the reservoir. The reservoir includes a through hole for providing the fluid to the microfluidic semiconductor die 10a, which is configured to expel the fluid through the nozzles.

As shown in FIG. 5, the assembly 50a is coupled to two surfaces of the printhead 60 that are on different planes from each other. In particular, a first portion 53a of the assembly 50a is coupled to an upper first surface 62 of the printhead 60, while a second portion 53b of the assembly 50a is coupled to a side second surface 64 of the printhead 60.

The first and second surfaces 62, 64 in the illustrated embodiment are perpendicular to each other such that the first and second portions 53a, 53b of the flexible interconnect substrate 31 are bent relative to each other at a 90° angle. In other embodiments, the flexible interconnect substrate 31 may be mounted to surfaces of the printhead 60 at different angles. In particular, the portions 53a, 53b may be at an angle that is less 90°.

The flexible interconnect substrate 31 is coupled to the reservoir such that the second through opening 56 is located at the bend. In that regard, the second through opening 56 releases stress that may occur in the assembly 50a due to the bend. In particular, stress that may occur in the conductive features of the assembly 50a, including the traces and conductive elements coupling the die to the flexible interconnect substrate, may be released by the second through opening 56.

Figure 6:
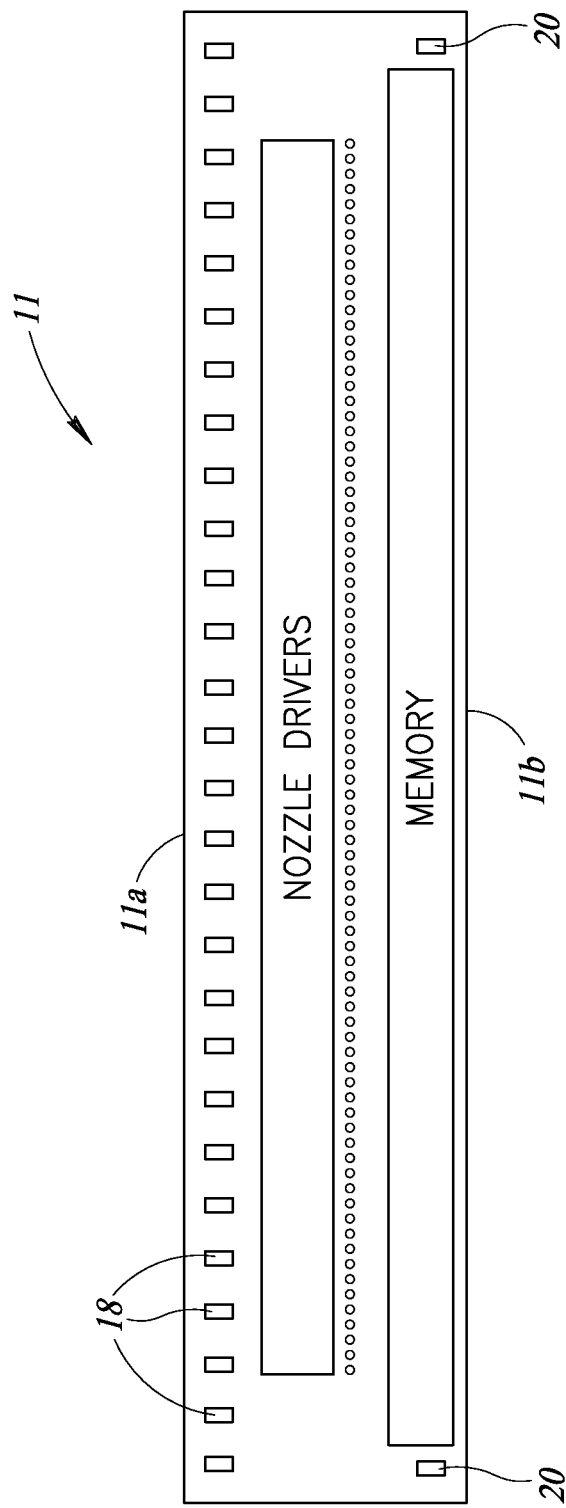
FIG. 6 is a schematic illustration of a microfluidic semiconductor die according to another embodiment.

FIG. 6 is a schematic illustration of a microfluidic semiconductor die 10a according to another embodiment. The microfluidic semiconductor die 10a of FIG. 6 is the same as the microfluidic semiconductor die 10 of FIG. 1A, except that the microfluidic semiconductor die 10a of FIG. 6 shows two mechanical pads 20 located on the upper surface along the second side 11b of the microfluidic semiconductor die 10a, rather than the four mechanical pads 20 of FIG. 1A. It is to be appreciated that the layout of the mechanical pads 20 of a die will correspond to the layout of the mechanical contacts of the flexible interconnect substrate to be used to form an assembly. That is, the microfluidic semiconductor die 10a of FIG. 6 will be coupled to a flexible interconnect substrate that includes two mechanical contacts at the second side of the through opening of the flexible interconnect substrate.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An assembly comprising:
  a microfluidic semiconductor die including an active surface, a plurality of electrical bond pads located on the active surface proximate a first side of the die and a plurality of mechanical bond pads on the active surface proximate a second side of the die that is opposite the first side, the mechanical bond pads being electrically decoupled from active electrical components of the die, the die including an inlet that is in fluid communication with a plurality of nozzles for expelling fluid received by the inlet;
  a flexible interconnect substrate including a through opening, the active surface of the microfluidic semiconductor die located in the through opening, the flexible interconnect substrate including a plurality of electrical contacts that extend into the through opening and a plurality of mechanical contacts that extend into the through opening;
  first conductive elements that couple the plurality of electrical bond pads of the microfluidic semiconductor die to the plurality of electrical contacts of the flexible interconnect substrate; and
  second conductive elements that couple the plurality of mechanical bond pads of the microfluidic semiconductor die to the plurality of mechanical contacts of the flexible interconnect substrate.

2. The assembly of claim 1 wherein the mechanical contacts of the flexible interconnect substrate are coupled to each other by traces.

3. The assembly of claim 1 wherein the first and second conductive elements are wire bonds, tape automated bonds (TAB), solder balls, and anisotropic conductive film (ACF).

4. The assembly of claim 1 wherein a back surface of the microfluidic semiconductor die extends from the through opening of the flexible interconnect substrate.

5. The assembly of claim 1 wherein the plurality of nozzles are located between the plurality of electrical bond pads and the plurality of mechanical bond pads.

6. The assembly of claim 1 wherein the plurality of electrical contacts extend into the through opening at a first side of the through opening and the plurality of mechanical contacts extend into the through opening at a second side of the through opening, wherein the plurality of mechanical contacts are evenly spaced from each other along the second side of the through opening.

7. The assembly of claim 1 wherein the mechanical bond pads are coupled to ground.

8. The assembly of claim 1 wherein a back surface of the microfluidic semiconductor die is coupled to a substrate, the substrate having a through hole that is in fluid communication with the inlet of the microfluidic semiconductor die.

9. An assembly comprising:
a microfluidic semiconductor die including an active surface, a plurality of electrical bond pads located on the active surface along a first side of the die and a plurality of mechanical bond pads on the active surface along a second, opposite side of the die, the mechanical bond pads being electrically decoupled from active electrical components of the die, the die including an inlet that is in fluid communication with a plurality of nozzles for expelling fluid received by the inlet;
a flexible interconnect substrate including a through opening at a first end and a plurality of interconnect contacts at a second end, the active surface of the microfluidic semiconductor die located in the through opening, the flexible interconnect substrate including a plurality of electrical contacts that extend into the through opening and a plurality of mechanical contacts that extend into the through opening;
first conductive elements that couple the plurality of electrical bond pads of the microfluidic semiconductor die to the plurality of electrical contacts of the flexible interconnect substrate; and
second conductive elements that couple the plurality of mechanical bond pads of the microfluidic semiconductor die to the plurality of mechanical contacts of the flexible interconnect substrate.

10. The assembly of claim 9 wherein the through opening of the flexible interconnect substrate is a first through opening, the flexible interconnect substrate including a second through opening, the second through opening being located between the first through opening at the first end and the plurality of interconnect contacts at the second end.

11. The assembly of claim 9 wherein the first end of the flexible interconnect substrate is coupled to a first surface and the second end of the flexible interconnect substrate is coupled to a second surface, the second surface being angled from the first surface such that a central portion of the flexible interconnect substrate is bent.

12. The assembly of claim 9 wherein the mechanical contacts of the flexible interconnect substrate are coupled to each other by traces.

13. The assembly of claim 9 wherein the plurality of mechanical contacts are larger than the plurality of electrical contacts.

14. The assembly of claim 9 wherein the assembly is coupled to a printhead.

15. An assembly comprising:
a microfluidic semiconductor die including an active surface, a plurality of electrical bond pads located on the active surface proximate a first side of the die and a plurality of mechanical bond pads on the active surface proximate a second side of the die that is opposite the first side, the mechanical bond pads being electrically decoupled from active electrical components of the die, the die including an inlet and a plurality of nozzles, the inlet being in fluid communication with the plurality of nozzles;
a flexible interconnect substrate including a through opening, the active surface of the microfluidic semiconductor die at the through opening of the flexible interconnect substrate, the flexible interconnect substrate including a plurality of electrical contacts and a plurality of mechanical contacts;
first conductive elements coupling the plurality of electrical bond pads of the microfluidic semiconductor die to the plurality of electrical contacts of the flexible interconnect substrate; and
second conductive elements coupling the plurality of mechanical bond pads of the microfluidic semiconductor die to the plurality of mechanical contacts of the flexible interconnect substrate.

16. The assembly of claim 15 wherein the mechanical contacts of the flexible interconnect substrate are coupled to each other by traces.

17. The assembly of claim 15 wherein the mechanical bond pads are coupled to ground, wherein the second conductive elements and the first conductive elements are conductive bumps.

18. The assembly of claim 15 the plurality of electrical contacts and the plurality of mechanical contacts extend into the through opening of the flexible interconnect substrate.

19. The assembly of claim 15 wherein an active surface of the microfluidic semiconductor die is located in the through opening of the flexible interconnect substrate.

20. The assembly of claim 19 wherein a back surface of the microfluidic semiconductor die extends from the through opening of the flexible interconnect substrate.

* * * * *